US007018789B2

(12) United States Patent
Maezawa et al.

(10) Patent No.: US 7,018,789 B2
(45) Date of Patent: Mar. 28, 2006

(54) RADIOGRAPHIC IMAGE CONVERSION PANEL, METHOD FOR MANUFACTURING THE SAME, METHOD FOR FORMING PHOSPHOR PARTICLE, METHOD FOR FORMING PHOTOSTIMULABLE PHOSPHOR PRECURSOR, PHOSPHOR PRECURSOR AND PHOTOSTIMULABLE PHOSPHOR

(75) Inventors: Akihiro Maezawa, Hino (JP); Noriyuki Mishina, Hino (JP)

(73) Assignee: Konica Minolta Holdings, Inc., (JP)

( * ) Notice: Subject to any disclaimer, the term of this patent is extended or adjusted under 35 U.S.C. 154(b) by 131 days.

(21) Appl. No.: 10/719,919

(22) Filed: Nov. 21, 2003

(65) Prior Publication Data

US 2004/0104376 A1 Jun. 3, 2004

(30) Foreign Application Priority Data

Nov. 27, 2002 (JP) ............................. 2002-343432
Mar. 24, 2003 (JP) ............................. 2003-079233

(51) Int. Cl.
*G03C 1/725* (2006.01)
*G03C 1/74* (2006.01)
*H05B 33/00* (2006.01)
*C23C 16/08* (2006.01)
*B05B 5/00* (2006.01)

(52) U.S. Cl. ........................ 430/496; 430/21; 430/139; 250/484.4; 427/157; 427/255.39

(58) Field of Classification Search .................. 430/21, 430/139, 496; 252/301.6, 301.4; 427/157, 427/255.39; 250/484.4
See application file for complete search history.

(56) References Cited

U.S. PATENT DOCUMENTS

2002/0041977 A1* 4/2002 Iwabuchi et al. ........... 428/690
2002/0104974 A1* 8/2002 Hosoi ......................... 250/584
2003/0155529 A1* 8/2003 Morikawa et al. ....... 250/484.4

* cited by examiner

*Primary Examiner*—Richard L. Schilling
(74) *Attorney, Agent, or Firm*—Cantor Colburn LLP

(57) ABSTRACT

A radiographic image conversion panel includes: a support; and at least one photostimulable phosphor layer provided on the support, wherein at least one layer of the photostimulable phosphor layers is formed by a photostimulable phosphor, and an amount of an activation metal atom at an end of a photostimulable phosphor crystal and an amount of an activation metal atom in the vicinity of the support satisfy a specific formula.

3 Claims, 2 Drawing Sheets

RADIOGRAPHIC IMAGE CONVERSION PANEL, METHOD FOR MANUFACTURING THE SAME, METHOD FOR FORMING PHOSPHOR PARTICLE, METHOD FOR FORMING PHOTOSTIMULABLE PHOSPHOR PRECURSOR, PHOSPHOR PRECURSOR AND PHOTOSTIMULABLE PHOSPHOR

BACKGROUND OF THE INVENTION

1. Field of the Invention

The present invention relates to a radiographic image conversion panel, a method for manufacturing the radiographic image conversion panel, a method for forming phosphor particles, a method for forming a photostimulable phosphor precursor, a phosphor precursor and a photostimulable phosphor.

2. Description of Related Art

In earlier technology, so-called radiography in which a silver salt is used in order to obtain a radiographic image has been utilized. However, a method for imaging a radiological image without using a silver salt has been developed. That is, a method for imaging by absorbing a radiation ray transmitted through a subject in a phosphor, thereafter, exciting the phosphor with a certain type of energy, and radiating the radiographic energy accumulated in the phosphor as a fluorescence is disclosed.

Concretely, a radiographic image conversion method in which a panel provided with a photostimulable phosphor layer on a support and either or both of visible ray and infrared ray is used as excitation energy has been known (see U.S. Pat. No. 3,859,527 specification).

As radiographic image conversion methods using photostimulable phosphors having higher luminance and higher sensitivity, a radiographic image conversion method using a BaFX:$Eu^{2+}$ system (X: Cl, Br, I) phosphor (for example, see Japanese Patent Laid-Open Publication No. Sho 59-75200), a radiographic image conversion method using an alkali halide phosphor (for example, see Japanese Patent Laid-Open Publication No. Sho 61-72087), and an alkali halide phosphor containing metals of $Tl^{+}$, $Ce^{3+}$, $Sm^{3+}$, $Eu^{3+}$, $Y^{3+}$, $Ag^{+}$, $Mg^{2+}$, $Pb^{2+}$, $In^{3+}$ as co-activators (for example, see Japanese Patent Laid-Open Publications Nos. Sho 61-73786 and Sho 61-73787) are developed.

Furthermore, recently, in analysis of diagnostic imaging, a radiographic image conversion panel having higher sharpness has been required. As a method for improving the sharpness, for example, attempts for improving sensitivity and sharpness by controlling the shape of photostimulable phosphors (hereinafter, also referred to as phosphors) have been made.

As one of these attempts, for example, there is a method for using a photostimulable phosphor layer having a fine quasi-columnar block formed by depositing a photostimulable phosphor on a support having a fine concavoconvex pattern (for example, see Japanese Patent Laid-Open Publication No. Sho 61-142497).

Further, a method for using a radiographic image conversion panel having a photostimulable phosphor layer in which cracks between columnar blocks obtained by depositing a photostimulable phosphor on a support having a fine pattern are shock-treated to be further developed (for example, see Japanese Patent Laid-Open Publication No. Sho 61-142500), further, a method for using a quasi-columnar radiographic image conversion panel in which cracks are caused from the surface side of a photostimulable phosphor layer formed on a support (for example, see Japanese Patent Laid-Open Publication No. Sho 62-39737), furthermore, a method for providing cracks by forming a photostimulable phosphor layer having a void on a support according to deposition, and thereafter, by growing the void according to heat treatment (for example, see Japanese Patent Laid-Open Publication No. Sho 62-110200), and the like are suggested.

Furthermore, a radiographic image conversion panel having a photostimulable phosphor layer in which an elongated columnar crystal having a constant slope to a normal line direction of a support is formed on the support according to a vapor phase deposition method (for example, see Japanese Patent Laid-Open Publication No. Hei 2-58000) is suggested.

Any of these processes of controlling shapes of the photostimulable phosphor layer is characterized in that since the transversal diffusion of stimulating excitation light or stimulated fluorescence can be suppressed, by rendering the photostimulable phosphor layer columnar (the light reaches the support surface while repeating reflection in a crack (columnar crystal) interface), the sharpness of images formed by the stimulated fluorescence can be noticeably increased.

Recently, a radiographic image conversion panel using a photostimulable phosphor in which Eu is activated to a ground material of alkali halide such as CsBr or the like is suggested. Particularly, it became possible to derive a high X-ray conversion efficiency, which was unable to be obtained in earlier technology, by using Eu as an activator.

However, diffusion of Eu according to heat is remarkable, and there is a problem such that the dispersion of Eu is easily caused and the existence of Eu in a ground material is distributed unevenly since the vapor pressure under vacuum is also high. Thereby, it has not yet been in practical use at market since it is difficult to activate it by using Eu and to obtain a high X-ray conversion efficiency.

Particularly, in activation of rare-earth element which is excellent in a high X-ray conversion efficiency, with respect to deposited film formation under vacuum, uniformizing is more difficult problem than vapor pressure property. Further, in manufacturing method, there is a problem such that the existence state of the activator becomes nonuniform since a number of heat treatments, such as heating of raw materials when preparing the photostimulable phosphor layers, heating of substrates (supports) at the time of vacuum deposition, and anneling (strain relaxation of substrates (supports)) treatment after film formation, is performed to these photostimulable phosphor layers formed by vapor phase growth (deposition). Further, there is a problem relating to the durability thereof.

Therefore, there have been demanded improvements in luminance, sharpness and durability which are demanded from a market as the radiographic image conversion panel.

On the other hand, particularly, in activation by a rare earth element which ensures high X-ray conversion efficiency, when forming a vapor deposition film in a vacuum, the heating during the vapor deposition generates a radiation heat on a substrate to exert an effect on a heat distribution of the substrate.

This heat distribution varies also depending on a degree of vacuum, and the crystal growth becomes uneven by the heat distribution to cause a rapid disturbance in the luminance and the sharpness, so that it is difficult to control these performances in the vacuum deposition film formation method.

When using a phosphor crystal prepared by using an alkali halide as the ground material, the performance as a phosphor is brought out by a single crystal forming method according to a vapor phase deposition method (a vacuum deposition method) or a pull method, and the phosphor crystal is sealed in a glass or metal case due to low moisture resistance thereof.

In the CsBr:Eu phosphor radiographic image conversion panel manufactured by using a vacuum deposition method, there are problems that the Eu cannot be stably diffused in a vacuum conditions at the formation described above and that the phosphor has a large limitation on the handling because it is sealed in a glass case due to low moisture resistance thereof and therefore, has difficulties in use for general purposes.

However, Eu has properties that diffusion by heat is remarkable and also the vapor pressure in a vacuum is high, so that there arises a problem that Eu is unevenly distributed in a ground material because it is easily dispersed in the ground material. Accordingly, it is difficult to activate a phosphor using Eu to attain high X-ray conversion efficiency and therefore, the method is not put into practical use on a market.

In the rare earth element activator which ensures high X-ray conversion efficiency, when employing the vacuum deposition film forming method, the heating during the vapor deposition generates a radiation heat on a substrate to exert an effect on a heat distribution of the substrate.

This heat distribution varies also depending on a degree of vacuum, and the crystal growth becomes uneven by the heat distribution to cause a rapid disturbance in the luminance and the sharpness, so that it is difficult to control these performances in the vacuum deposition film forming method (e.g., see Japanese Patent Laid-Open Publication No. H10-140148 and Japanese Patent Laid-Open Publication No. H10-265774). Accordingly, the vacuum deposition film forming method has problems in that, particularly, in the case of using the rare earth elements such as Eu, Eu cannot be stably diffused and the phosphor has a large limitation on the handling because it is sealed in a glass case due to low moisture resistance thereof. Further, the method is lacking in versatility because the raw material utilization efficiency is as low as only several % to 10%, resulting in high cost due to the low utilization efficiency.

Accordingly, in the market, there have been demanded improvements in production uniformity agreeing with the improvements of stability, luminance and sharpness which are required as a radiographic image conversion panel.

SUMMARY OF THE INVENTION

An object of the present invention is to provide a radiographic image conversion panel having high luminance, high sharpness and excellent durability, and to provide a manufacturing method of the radiographic image conversion panel.

Further, another object of the invention is to provide a radiographic image conversion panel which is excellent in uniformity of an activator in a phosphor layer and which exhibits high luminance and high sharpness, and to provide a method for manufacturing the radiographic image conversion panel.

In order to accomplish the above-mentioned object, in accordance with the first aspect of the present invention, a radiographic image conversion panel comprises:

a support; and at least one photostimulable phosphor layer provided on the support, wherein at least one layer of the photostimulable phosphor layers is formed by a photostimulable phosphor represented by a following general formula (1), and an amount of activation metal atoms at an end of a photostimulable phosphor crystal and an amount of activation metal atoms in the vicinity of the support satisfy a following formula 1:

$$0 \leqq \text{(the amount of the activation metal atoms at the end of the photostimulable phosphor crystal)/(the amount of the activation metal atoms in the vicinity of the support)} < 1,$$ and the general formula (1) is expressed by $$M^1X.aM^2X'_2.bM^3X''_3:eA \quad (1)$$

wherein the $M^1$ is at least one kind of alkali metal selected from a group consisting of Li, Na, K, Rb and Cs, the $M^2$ is at least one kind of bivalent metal atom selected from a group consisting of Be, Mg, Ca, Sr, Ba, Zn, Cd, Cu and Ni, the $M^3$ is at least one kind of trivalent metal atom selected from a group consisting of Sc, Y, La, Ce, Pr, Nd, Pm, Sm, Eu, Gd, Tb, Dy, Ho, Er, Tm, Yb, Lu, Al, Ga and In, each of the X, the X' and the X" is at least one kind of halogen selected from a group consisting of F, Cl, Br and I, the A is at least one kind of metal atom selected from a group consisting of Eu, Tb, In, Ce, Tm, Dy, Pr, Ho, Nd, Yb, Er, Gd, Lu, Sm, Y, Tl, Na, Ag, Cu and Mg and each of the a, the b and the e represents a numeric value in a range of $0 \leqq a < 0.5$, $0 \leqq b < 0.5$ and $0 < e \leqq 0.2$.

In accordance with the second aspect of the present invention, a radiographic image conversion panel comprises:

a support; and at least one photostimulable phosphor layer provided on the support, wherein at least one layer of the photostimulable phosphor layers contains a photostimulable phosphor using an alkali halide represented by a following general formula (1) as a ground material, and the photostimulable phosphor layer is formed so as to have a thickness from 50 μm to 20 mm by a vapor phase growth method (also referred to as "vapor phase deposition method", and a mean crystal size in the photostimulable phosphor of the photostimulable phosphor layer is from 90 to 1000 nm, and the general formula (1) is expressed by $$M^1X.aM^2X'_2.bM^3X''_3:eA \quad (1)$$

wherein the $M^1$ is at least one kind of alkali metal selected from a group consisting of Li, Na, K, Rb and Cs, the $M^2$ is at least one kind of bivalent metal atom selected from a group consisting of Be, Mg, Ca, Sr, Ba, Zn, Cd, Cu and Ni, the $M^3$ is at least one kind of trivalent metal atom selected from a group consisting of Sc, Y, La, Ce, Pr, Nd, Pm, Sm, Eu, Gd, Tb, Dy, Ho, Er, Tm, Yb, Lu, Al, Ga and In, each of the X, the X' and the X" is at least one kind of halogen selected from a group consisting of F, Cl, Br and I, the A is at least one kind of metal atom selected from a group consisting of Eu, Tb, In, Ce, Tm, Dy, Pr, Ho, Nd, Yb, Er, Gd, Lu, Sm, Y, Tl, Na, Ag, Cu and Mg and each of the a, the b and the e represents a numeric value in a range of $0 \leqq a < 0.5$, $0 \leqq b < 0.5$ and $0 < e \leqq 0.2$.

The photostimulable phosphor may be CsBr:Eu.

In accordance with the third aspect of the present invention, a method for manufacturing the above radiographic image conversion panel, comprises controlling a deposition rate of a main agent of the photostimulable phosphor and a deposition rate of an activator of the photostimulable phosphor by at least two or more systems.

In accordance with the fourth aspect of the present invention, a method for manufacturing a radiographic image conversion panel comprises a support and a photostimulable phosphor layer provided on the support; the method comprising adding Rb atoms to a photostimulable phosphor of the photostimulable phosphor layer so that a ratio of the Rb atoms to Cs atoms is 1/1,000,000 to 5/1,000 mol.

In accordance with the fifth aspect of the present invention, a radiographic image conversion panel comprises a photostimulable phosphor obtained by the method for manufacturing the above radiographic image conversion panel, wherein in the photostimulable phosphor, a main peak is shown from a (400) face in accordance with a result of X-ray diffraction.

The radiographic image conversion panel may comprise: a photostimulable phosphor layer, wherein the photostimulable phosphor layers contains the photostimulable phosphor using an alkali halide represented by a following general formula (1) as a ground material, the photostimulable phosphor layer is formed by spherical phosphor particles and a polymer material, the photostimulable phosphor layer is formed so as to have a thickness from 50 μm to 20 mm, the general formula (1) is expressed by $$M^1X.aM^2X'_2.bM^3X''_3:eA \quad (1)$$

wherein the $M^1$ is at least one kind of alkali metal selected from a group consisting of Li, Na, K, Rb and Cs, the $M^2$ is at least one kind of bivalent metal atom selected from a group consisting of Be, Mg, Ca, Sr, Ba, Zn, Cd, Cu and Ni, the $M^3$ is at least one kind of trivalent metal atom selected from a group consisting of Sc, Y, La, Ce, Pr, Nd, Pm, Sm, Eu, Gd, Tb, Dy, Ho, Er, Tm, Yb, Lu, Al, Ga and In, each of the X, the X' and the X" is at least one kind of halogen selected from a group consisting of F, Cl, Br and I, the A is at least one kind of metal atom selected from a group consisting of Eu, Tb, In, Ce, Tm, Dy, Pr, Ho, Nd, Yb, Er, Gd, Lu, Sm, Y, Ti, Na, Ag, Cu and Mg and each of the a, the b and the e represents a numeric value in a range of $0 \leqq a < 0.5$, $0 \leqq b < 0.5$ and $0 < e \leqq 0.2$.

Prefrably, phosphor fine particles in the photostimulable phosphor are formed by heating at 400° C. or more.

In accordance with the sixth aspect of the present invention, in a photostimulable phosphor precursor, phosphor particles in the above radiographic image conversion panel are formed in a vacuum.

In accordance with the seventh aspect of the present invention, a method for forming the above photostimulable phosphor precursor, comprises:

sequentially forming a liquid membrane phase in a liquid phase containing Cs atoms, and adding an organic solvent having a solubility different from that of the liquid phase containing Cs atoms under stirring.

In accordance with the eighth aspect of the present invention, a photostimulable phosphor obtained by calcining the above phosphor precursor at 600 to 800° C.

BRIEF DESCRIPTION OF THE DRAWINGS

The present invention will become more fully understood from the detailed description given hereinbelow and the accompanying drawing which are given by way of illustration only, and thus are not intended as a definition of the limits of the present invention, and wherein.

PREFERRED EMBODIMENTS OF THE INVENTION

Figure 1:
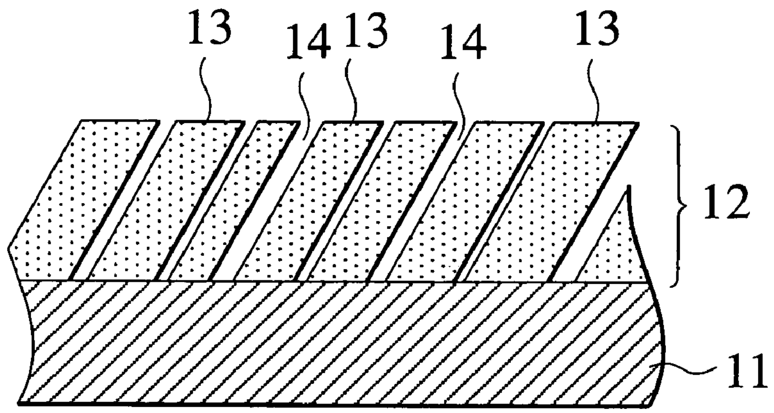
FIG. 1 is a cross-sectional view showing one example of the photostimulable phosphor layer having a columnar crystal formed on the support.

Hereinafter, the present invention will be described in detail below.

First Embodiment:

In the first embodiment of the radiographic image conversion panel according to the present invention, the radiographic image conversion panel comprises a support, and at least one photostimulable phosphor layer provided on the support, wherein at least one layer of the photostimulable phosphor layers is formed by the photostimulable phosphor represented by the general formula (1) described below, and the amount of the activation metal atoms (activator: Eu) at the front end of the photostimulable phosphor crystals and the amount of the activation metal atoms (activator: Eu) in the vicinity of the support satisfy the following formula (1).

$$0 \leqq \text{(the amount of the activation metal atoms at the front end of photostimulable phosphor crystals)/(the amount of Eu in the vicinity of the support)} < 1 \quad \text{Formula (1)}$$

Measuring method of the amount of Eu

A part corresponding to 20% of the total length in a thickness direction of the vapor deposition film crystal is taken out from the front end of the crystal and designated as the part of the front end of the crystal.

A part corresponding to 20% of the total length in a thickness direction of the vapor deposition film crystal is taken out from the support side and designated as the support side of the crystal.

As for the takeout, the part may be mechanically cut out by a spatula and the like, or may be cut out by performing an ion beam machining such as FIB.

The powder cut out is dissolved in water and the amount of Eu can be analyzed and measured by using ICP.

The crystal cut out can be measured on the amount of Eu by using TOF-SIMS.

Next, the photostimulable phosphor represented by the general formula (1), which is preferably used in the present invention, will be explained.

General Formula (1)

$$M^1X.aM^2X'_2.bM^3X''_3:eA \quad (1)$$

wherein the $M^1$ is at least one kind of alkali metal selected from a group consisting of Li, Na, K, Rb and Cs, the $M^2$ is at least one kind of bivalent metal atom selected from a group consisting of Be, Mg, Ca, Sr, Ba, Zn, Cd, Cu and Ni, the $M^3$ is at least one kind of trivalent metal atom selected from a group consisting of Sc, Y, La, Ce, Pr, Nd, Pm, Sm, Eu, Gd, Tb, Dy, Ho, Er, Tm, Yb, Lu, Al, Ga and In, each of the X, the X' and the X" is at least one kind of halogen selected from a group consisting of F, Cl, Br and I, the A is at least one kind of metal atom selected from a group consisting of Eu, Tb, In, Ce, Tm, Dy, Pr, Ho, Nd, Yb, Er, Gd, Lu, Sm, Y, Tl, Na, Ag, Cu and Mg and each of the a, the b and the e represents a numeric value in a range of $0 \leqq a < 0.5$, $0 \leqq b < 0.5$ and $0 < e \leqq 0.2$.

In the photostimulable phosphor represented by the general formula (1), $M^1$ represents at least one alkali metal atom selected from a group consisting of Li, Na, K, Rb and Cs. Among these, at least one alkali earth metal atom is preferably selected from a group consisting of Rb and Cs, and Cs atom is more preferable.

$M^2$ represents at least one divalent metal atom selected from a group consisting of Be, Mg, Ca, Sr, Ba, Zn, Cd, Cu and Ni. Among these, a divalent metal atom selected from a group consisting of Be, Mg, Ca, Sr and Ba is preferably used.

$M^3$ represents at least one trivalent metal atom selected from a group consisting of Sc, Y, La, Ce, Pr, Nd, Pm, Sm, Eu, Gd, Tb, Dy, Ho, Er, Tm, Yb, Lu, Al, Ga and In. Among these, a trivalent metal atom selected from a group consisting of Y, Ce, Sm, Eu, Al, La, Gd, Lu, Ga and In is preferably used.

A is at least one metal atom selected from a group consisting of Eu, Tb, In, Ce, Tm, Dy, Pr, Ho, Nd, Yb, Er, Gd, Lu, Sm, Y, Tl, Na, Ag, Cu and Mg.

From the viewpoint of the improvement in stimulated emission luminance of the photostimulable phosphor, X, X' and X" each represents at least one halogen atom selected from a group consisting of F, Cl, Br and I. Preferred is at least one halogen atom selected from a group consisting of F, Cl and Br, and more preferred is at least one halogen atom selected from a group consisting of Br and I.

In the compound represented by the general formula (1), a is a number within the range of $0 \leqq a < 0.5$, preferably $0 \leqq a < 0.01$; b is a number within the range of $0 \leqq b < 0.5$, preferably $0 \leqq b \leqq 10^{-2}$; and e is a number within the range of $0 < e \leqq 0.2$, preferably $0 < e \leqq 0.1$.

The photostimulable phosphor represented by the general formula (1) is prepared, for example, by a preparation method described below.

First, as phosphor raw materials, the following crystal is prepared by adding an acid (HI, HBr, HCl or HF) to a carbonate and mixing under stirring. Then, the mixture is filtered at a point of neutralization to obtain a filtrate. The water content of the filtrate is vaporized to obtain the following composition.

As the phosphor raw materials, there may be employed:

(a) at least one compound selected from NaF, NaCl, NaBr, NaI, KF, KCl, KBr, KI, RbF, RbCl, RbBr, RbI, CsF, CsCl, CsBr and CsI;

(b) at least one compound selected from $MgF_2$, $MgCl_2$, $MgBr_2$, $MgI_2$, $CaF_2$, $CaCl_2$, $CaBr_2$, $CaI_2$, $SrF_2$, $SrCl_2$, $SrBr_2$, $SrI_2$, $BaF_2$, $BaCl^2$, $BaBr_2$, $BaBr_2.2H_2O$, $BaI_2$, $ZnF_2$, $ZnCl_2$, $ZnBr_2$, $ZnI_2$, $CdF_2$, $CdCl_2$, $CdBr_2$, $CdI_2$, $CuF_2$, $CuCl_2$, $CuBr_2$, CuI, $NiF_2$, $NiCl_2$, $NiBr_2$ and $NiI_2$; and (c) a compound having a metal atom selected from a group consisting of Eu, Tb, In, Cs, Ce, Tm, Dy, Pr, Ho, Nd, Yb, Er, Gd, Lu, Sm, Y, Ti, Na, Ag, Cu and Mg.

The phosphor raw materials of the above-described (a)–(c) are weighed so as to form a mixture composition within the above-described number range, and dissolved in purified water.

At this time, the materials may be thoroughly mixed by use of a mortar, a ball mill, a mixer mill, etc.

Next, to the aqueous solution obtained, a predetermined acid is added so that a pH value C of the solution is adjusted to $0 < C < 7$, then, the water content is evaporated from the solution.

Next, the raw material mixture obtained is filled in a heat-resisting vessel such as a quartz crucible or an alumina crucible, and calcination is conducted in an electric furnace. The calcination temperature may be preferably from 500 to 1000° C. The calcination time, which may differ depending on the filled amount of the raw material mixture, the calcination temperature, etc., may be preferably from 0.5 to 6 hours.

The calcination atmosphere may be preferably a weak reducing atmosphere such as a nitrogen gas atmosphere containing a small amount of hydrogen gas and a carbon dioxide atmosphere containing a small amount of carbon monoxide, a neutral atmosphere such as a nitrogen gas atmosphere and an argon gas atmosphere, or a weak oxidizing atmosphere containing a small amount of oxygen gas.

Further, if the mixture is once calcined under the above calcination conditions, the calcined product is then taken out from the electric furnace for pulverization, and then the calcined product powder is again filled in a heat-resisting vessel and placed in the electric furnace to carry out re-calcination under the same calcination conditions as described above, the emission luminance of phosphors can be further enhanced. Also, during cooling of the calcined product from the calcination temperature to a room temperature, if the calcined product is taken out from the electric furnace and left to cool in an air, a desired phosphor can be obtained, or the product may be cooled in the same weak reducing atmosphere or neutral atmosphere as that during the calcination. Also, if the calcined product is cooled quickly in a weak reducing atmosphere, a neutral atmosphere or a weak oxidizing atmosphere by moving it from the heating section to the cooling section in the electric furnace, the stimulated emission luminescence of phosphors obtained can be further enhanced.

In the above-described photostimulable phosphors, photostimulable phosphor particles containing iodine are preferable. For example, iodine-containing bivalent europium activated alkali earth metal fluorohalide phosphors, iodine-containing bivalent europium activated alkali earth metal halide phosphors, iodine-containing rare earth element activated rare earth oxyhalide phosphors, and iodine-containing bismuth activated alkali metal halide phosphors are preferable because these phosphors exhibit high luminance stimulated fluorescence, and a particularly preferable photostimulable phosphor is an Eu added BaFI compound.

Further, the photostimulable phosphor layer of the present invention is formed by a vapor phase growth method.

As the vapor phase growth method of the photostimulable phosphor, a vapor deposition method, a sputtering method, a CVD method, an ion plating method, or the like can be used.

In the present invention, for example, the following methods can be used.

In the first vapor deposition method, a support is first placed in a vapor deposition apparatus and the apparatus is then degassed to a degree of vacuum of about $1.333 \times 10^{-4}$ Pa.

Then, at least one of the photostimulable phosphors is heated and evaporated by the resistance heating method, the electron beam method, etc. to have the photostimulable phosphor with a desired thickness grown on the support surface.

As a result, a photostimulable phosphor layer containing no binder is formed; it is also possible to form the photostimulable phosphor layer in a plurality of repetitions of the vapor deposition step.

In the vapor deposition step, it is also possible to have the photostimulable phosphors co-vaporized using a plurality of resistive heaters or electron beams in order to synthesize the intended photostimulable phosphor on the support and form the photostimulable phosphor layer concurrently.

After completion of vapor deposition, the photostimulable phosphor layer is provided with a protective layer on its side opposite to the support side if necessary, to manufacture the radiographic image conversion panel of the present invention. Alternatively, it is allowed to have the photostimulable phosphor layer formed on a protective layer first, and then to provide it with a support.

In the vapor deposition method, it is also allowed to cool or heat the layer to be deposited onto the member to be deposited (the support, the protective layer or the intermediate layer) during vapor deposition if necessary.

In addition, it is allowed to heat-treat the photostimulable phosphor layer after the completion of vapor deposition. In the vapor deposition method, it is also allowed to perform the reactive vapor deposition of depositing the phosphors while introducing a gas such as $O_2$ or $H_2$ if necessary.

In the second sputtering method, a support having thereon a protective layer or an intermediate layer is placed in a sputtering apparatus similarly to the vapor deposition method, then the apparatus is once degassed to a degree of vacuum of about $1.333\times10^{-4}$ Pa, and subsequently such an inert gas as Ar or Ne is introduced, as a sputtering gas, into the sputtering apparatus to raise the gas pressure up to about $1.333\times10^{-1}$ Pa. And then the photostimulable phosphor as a target is sputtered to have a layer of the stimulated phosphor with a desired thickness grown on the support.

In the sputtering step, various application processes can be used similarly to the vapor deposition method.

As the third method, there is a CVD method. As the fourth method, there is an ion plating method.

Further, a growth rate of the photostimulable phosphor layer in the vapor phase growth method is preferably from 0.05 to 300 μm/min. When the growth rate is less than 0.05 μm/min., productivity of the radiographic image conversion panel of the present invention is poor and this is not preferred. When the growth rate is in excess of 300 μm/min., control of the growth rate is difficult and this is also not preferred.

In the case of obtaining the radiographic image conversion panel by the vacuum deposition method, the sputtering method, etc., since a binder is not present, a packing density of the photostimulable phosphor can be increased, so that the radiographic image conversion panel obtained is preferable in terms of sensitivity and resolving power.

Further, the radiographic image conversion panel of the first embodiment is preferably manufactured by the binary vapor deposition method in the vapor phase growing methods. The binary vapor deposition method is described below by referring to the phosphor CsBr:Eu.

In the present invention, when preparing a photostimulable phosphor layer by a vapor phase method, the main agent deposition rate and activator deposition rate in the photostimulable phosphor is controlled by at least two or more systems, for example, a binary vapor deposition method for separately depositing an Eu (activator) source and a CsBr (main agent) source is applied.

The object of the binary vapor deposition method in the present invention is to control the obtained deposition crystallinity, for example, by controlling the amount of Eu incorporated into crystals, as a result, the radiographic image conversion panel having excellent luminance, sharpness and durability can be obtained.

In the binary vapor deposition method, for example, the Eu introduction method include a case of using two evaporation sources having different concentrations of CsBr:Eu, a case of using two evaporation sources of CsBr element (main agent) and Eu element (activator) and a case of using two evaporation sources of CsBr:Eu element (main agent) and Eu element (activator).

In any case, the amount of Eu (activator) introduced can be controlled by controlling the Eu (activator) introduction by the use of at least two or more systems. The upper limit of the system is 100 systems or less.

The amount of Eu (activator) is as small as from 1/10,000 to 1/100 to CsBr as a main agent and therefore, when the film-forming rate of a phosphor film is decreased, the volatile amount is extremely reduced to result in difficulty of the film formation. For attaining the film formation, it is advantageous to increase the film-forming rate, however, when the film-forming rate is extremely increased, a concentration distribution of Eu becomes uneven due to fluctuation at the vapor deposition.

The deposition rate of the main agent and the activator is preferably from 1 to 100 μm/min.

In order to solve this problem, boats at the binary vapor deposition are preferably fixed twice or more for the Eu evaporation source.

The size of the boat is preferably from 1:2 to 1:10 due to limitation in an arrangement of a deposition apparatus.

In order to evaporate Eu, a resistance heating source disposed in the deposition apparatus is disposed on Eu so as to form a film through a slit, and this is preferable in terms of further exerting an effect of the present invention. In addition, the slit is effective in preventing bumping of Eu.

That is, for improving the crystallinity in the outermost surface layer side of the phosphor, the concentration of Eu is decreased to form a crystal having excellent crystallinity and high transparency.

In the present invention, a rare earth Eu is preferably incorporated into the phosphor raw materials in an amount of from 1 to 100 times the Eu amount to be introduced into the deposition film.

Further, a mean crystal size of the phosphor in the photostimulable phosphor layer of the present invention is preferably from 90 to 1000 nm.

A film thickness of the photostimulable phosphor layer varies depending on the intended use of the radiographic image conversion panel and the type of the photostimulable phosphor, however, it is in the range of 50 μm to 20 mm, preferably 50 μm to 1 mm, more preferably in the range of 50 to 300 μm, further more preferably in the range of 100 to 300 μm, still more preferably in the range of 150 to 300 μm from the viewpoint of obtaining the effect of the present invention.

In preparing the photostimulable phosphor layer according to the vapor phase growth method, a temperature of the support where the photostimulable phosphor layer is formed is preferably set to 100° C. or more, more preferably 150° C. or more, still more preferably 150 to 400° C.

Further, the photostimulable phosphor layer of the present invention preferably has a light reflective index of 20% or more, more preferably 30% or more, still more preferably 40% or more, from the viewpoint of obtaining the radiographic image conversion panel exhibiting high sharpness. Here, the upper limit is 100%.

Further, a filler such as a binder may be filled in a gap between the columnar crystals, whereby the photostimulable phosphor layer is reinforced. In addition, a substance having high percent absorption or high reflectance of light may be filled, whereby not only a reinforcing effect is produced on the photostimulable phosphor layer but also the transversal diffusion of the stimulating excitation light that entered the photostimulable phosphor layer can be effectively reduced.

Figure 2:
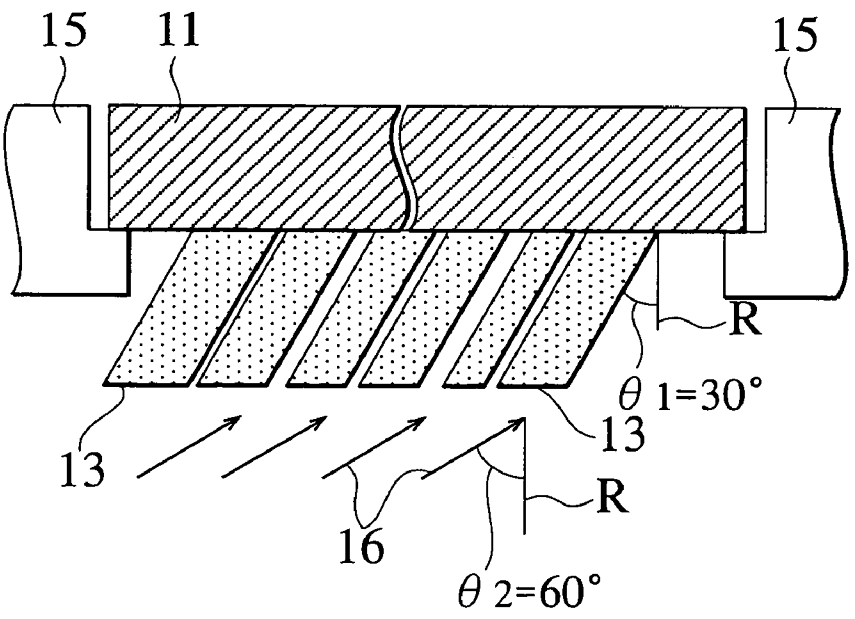
FIG. 2 is a view showing a state where the photostimulable phosphor layer is formed on the support by a vapor deposition method.

Next, the construction of the photostimulable phosphor layer of the present invention is described by referring to FIGS. 1 and 2.

FIG. 1 is a schematic cross-sectional view showing one example of the photostimulable phosphor layer having a columnar crystal formed on the support by using the above-described vapor phase growth method. The reference numeral 11 denotes a support, 12 denotes a photostimulable phosphor layer, and 13 denotes a columnar crystal constructing the photostimulable phosphor layer. Incidentally, 14 denotes a gap formed between the columnar crystals.

FIG. 2 is a view showing a state where the photostimulable phosphor layer is formed on the support by the vapor deposition. When an incident angle of a photostimulable phosphor steam flow 16 to the normal line direction (R) of the support surface is $\theta_2$ (in FIG. 2, the steam flow enters at an angle of 60 degrees), an angle of the formed columnar crystal to the normal line direction (R) of the support surface is represented by $\theta_1$ (in FIG. 2, it is about 30 degrees, and experientially it is about half of the incident angle) and the columnar crystal is formed at this angle.

The photostimulable phosphor layer thus formed on the support has excellent directivity because of the absence of binder therein and therefore, it has high directivity of stimulating excitation light and stimulated fluorescence, so that the layer can be increased in the thickness than the radiographic image conversion panel having a dispersed-type photostimulable phosphor layer containing a photostimulable phosphor dispersed in a binder. Further, the scattering of stimulating excitation light in the photostimulable phosphor layer decreases to result in improvement in the sharpness of images.

Further, a filler such as a binder may be filled in a gap between the columnar crystals, whereby the photostimulable phosphor layer is reinforced. In addition, a substance having high percent absorption or high reflectance of light may be filled, whereby not only a reinforcing effect is produced on the photostimulable phosphor layer but also the transversal diffusion of the stimulating excitation light that entered the photostimulable phosphor layer can be effectively reduced.

The substance having high reflectance of light means a substance having high reflectance for stimulating excitation light (500–900 nm, specifically 600–800 nm). For example, there may be used aluminum, magnesium, silver, indium, and other metals, a white pigment and a green or red coloring material. The white pigment can reflect also light emitted from a stimulated fluorescence.

Examples of the white pigments include $TiO_2$ (anatase type, rutile type), MgO, $PbCO_3.Pb(OH)_2$, $BaSO_4$, $Al_2O_3$, $M_{(II)}FX$ (provided that $M_{(II)}$ is at least one atom selected from a group consisting of Ba, Sr and Ca; X is a Cl atom or a Br atom), $CaCO_3$, ZnO, $Sb_2O_3$, $SiO_2$, $ZrO_2$, lithopone ($BaSO_4$.ZnS), magnesium silicate, basic lead siliconsulfate, basic lead phosphate, and aluminum silicate.

Since these white pigments have a strong hiding power and great refractive index, they easily scatter stimulated fluorescence by reflection or refraction of light, thus permitting noticeable improvement of the sensitivity of the obtained radiographic image conversion panel.

Examples of the substances of high absorption include carbon black, chromium oxide, nickel oxide, and iron oxide; and a blue coloring material. Of these substances, carbon black absorbs also light emitted from a photostimulable phosphor.

As the coloring material, any organic or inorganic coloring material can be used.

Examples of the organic coloring materials include Zapon Fast Blue 3G (produced by Hoechst), Estrol Brill Blue N-3RL (produced by Sumitomo Chemical Co., Ltd.), D & C Blue No. 1 (produced by National Aniline), Spirit Blue (produced by Hodogaya Chemical Co., Ltd.), Oil Blue No. 603 (produced by Orient Chemical Industries Co., Ltd.), Kiton Blue A (produced by Chiba-Geigy), Aizen Catiron Blue GLH (produced by Hodogaya Chemical Co., Ltd.), Lake Blue AFH (produced by Kyowa Sangyo), Primocyanine 6GX (produced by Inabata & Co., Ltd.), Brill Acid Green 6BH (produced by Hodogaya Chemical Co., Ltd.), Cyan Blue BNRCS (produced by Toyo Ink Mfg. Co., Ltd.), and Lionoil Blue SL (produced by Toyo Ink Mfg. Co., Ltd.).

Mention may also be made of organic metal complex salt coloring materials such as Color Index Nos. 24411, 23160, 74180, 74200, 22800, 23154, 23155, 24401, 14830, 15050, 15760, 15707, 17941, 74220, 13425, 13361, 13420, 11836, 74140, 74380, 74350, and 74460.

Examples of the inorganic coloring materials include inorganic pigments such as ultramarine, cobalt blue, cerulean blue, chromium oxide, and $TiO_2$—ZnO—Co—NiO.

As the support to be used for the radiographic image conversion panel of the present invention, various kinds of glasses, for example, polymer materials, metals, etc. may be employed. Preferred examples of the support include sheet glasses such as quartz glass, borosilicate glass and chemically reinforced glass; plastic films such as cellulose acetate film, polyester film, polyethylene terephthalate film, polyamide film, polyimide film, triacetate film and polycarbonate film; metal sheets such as aluminum sheet, iron sheet and copper sheet; or metal sheets having coated layers of the metal oxides.

Namely, the surface of these supports may be smooth, or may be matted to improve adhesiveness with the photostimulable phosphor layer.

Further, in the present invention, an adhesive layer may also be previously provided on the surface of the support, if necessary, for the enhancement of adhesiveness between the support and the photostimulable phosphor layer.

The layer thickness of these supports may vary depending on the material or the like of the supports to be used, but may generally range from 80 to 2000 μm, more preferably from 80 to 1000 μm from the viewpoint of handling.

Instead of the forming of the adhesive layer, application liquid including the photostimulable phosphor and a predetermined binder as a photostimulable phosphor layer, may be applied to the surface of the support. Alternatively, after the application liquid is applied to the surface of the support, the photostimulable phosphor layer may be bound.

Representative examples of the binders which is included in the application liquid, include proteins such as gelatin, polysaccharide such as dextran, natural polymeric materials such as arabic gum and synthetic polymeric materials such as polyvinyl butyral, polyvinyl acetate, nitrocellulose, ethylcellulose, vinylidene chloride.vinyl chloride copolymer, polyalkyl (metha)acrylate, vinyl chloride.vinylacetate copolymer, polyurethane, cellulose acetate butylate, polyvinyl alcohol and linear polyester. However, the present invention is characterized in that the binder is a resin mainly composed of a thermoplastic elastomer. Examples of the thermoplastic elastomer include the above-described polystyrene thermoplastic elastomer, polyolefin thermoplastic elastomer, polyurethane thermoplastic elastomer, polyester thermoplastic elastomer, polyamide thermoplastic elastomer, polybutadiene thermoplastic elastomer, ethylene-vinyl acetate thermoplastic elastomer, polyvinyl chloride thermoplastic elastomer, natural rubber thermoplastic elastomer, fluorine rubber thermoplastic elastomer, polyisoprene thermoplastic elastomer, chlorinated polyethylene thermoplastic elastomer, styrene-butadiene rubber and silicone rubber thermoplastic elastomer.

Among these, a polyurethane thermoplastic elastomer and a polyester thermoplastic elastomer are preferable because dispersibility is excellent due to high bonding strength between the elastomer and the phosphor, and ductility is also excellent to improve bending resistance of a radiation intensifying screen. In addition, these binders may be cured with a cross linking agent.

A mixing ratio of the binder and the photostimulable phosphor in the application liquid varies depending on the set value of a haze degree of the objective radiographic image conversion panel. The binder is preferably employed in an amount of 1 to 20 parts by mass, more preferably in an amount of 2 to 10 parts by mass based on the phosphor.

Examples of the organic solvents used for preparing the application liquid of the photostimulable phosphor layer include lower alcohols such as methanol, ethanol, isopropanol and n-butanol; ketones such as acetone, methyl ethyl ketone, methyl isobutyl ketone and cyclohexanone; esters of a lower fatty acid and a lower alcohol such as methyl acetate, ethyl acetate and n-butyl acetate; ethers such as dioxane, ethylene glycol monoethyl ether and ethylene glycol monomethyl ether; aromatic compounds such as tolyol and xylol; halogenated hydrocarbons such as methylene chloride and ethylene chloride; and a mixture thereof.

In addition, there may be incorporated, in the application liquid, various additives, such as a dispersing agent for improving the dispersibility of the phosphor in the application liquid and a plasticizer for enhancing the bonding strength between the binder and the phosphor in the photostimulable phosphor layer after the formation. Examples of the dispersing agent used for such an object include phthalic acid, stearic acid, caproic acid and oleophilic surfactants. Examples of the plasticizer include phosphate esters such as triphenyl phosphate, tricresyl phosphate and diphenyl phosphate; phthalate esters such as diethyl phthalate, dimethoxyethyl phthalate; glycolic acid esters such as ethylphthalylethyl glycolate and butylphthalylbutyl glycolate; and polyesters of polyethylene glycol and aliphatic dibasic acid such as polyester of triethylene glycol and adipic acid, and polyester of diethylene glycol and succinic acid. In addition, there may be incorporated, in the application liquid of the photostimulable phosphor layer, a dispersing agent such as stearic acid, phthalic acid, caproic acid and oleophilic surfactants for the purpose of improving the dispersibility of the photostimulable phosphor particles.

The application liquid of the photostimulable phosphor layer can be prepared by using a dispersing apparatus, such as a ball mill, beads mill, sand mill, attritor, three-roll mill, high-speed impeller dispersing machine, Kady mill or ultrasonic homogenizer.

The application liquid as prepared above is uniformly coated on the surface of the support described later to form a coated film. The application can be carried out by conventional applicating means, such as doctor blade, roll coater, knife coater, comma coater, or lip coater.

Subsequently, the coated film formed by the above means is heated and dried to complete formation of the photostimulable phosphor layer on the support. The film thickness of the photostimulable phosphor layer varies depending on characteristics of the objective radiographic image conversion panel, the kind of photostimulable phosphors and the mixing ratio of the binder to the phosphor, however, in the present invention, it is preferably 0.5 μm to 1 mm, more preferably 10 to 500 μm.

Further, the photostimulable phosphor layer of the present invention may also have a protective layer.

This protective layer may be formed by directly applying a protective layer application liquid to the photostimulable phosphor layer, or may be provided by adhering on the photostimulable phosphor layer a protective layer previously separately formed, or may be provided by forming the photostimulable phosphor layer on a protective layer separately formed.

As materials for the protective layer, protective layer materials such as cellulose acetate, nitrocellulose, polymethyl methacrylate, polyvinyl butyral, polyvinyl formal, polycarbonates, polyesters, polyethylene terephthalate, polyethylene, polyvinylidene chloride, nylons, polytetrafluoroethylene, poly(trifluorochloroethylene), poly(tetrafluoroethylene)hexafluoro propylene copolymer, vinylidene chloride-vinyl chloride copolymer, and vinylidene chloride-acrylonitrile coplymer, are commonly used. In addition thereto, a transparent glass substrate may also be used as the protective layer.

Furthermore, the protective layer may be formed by depositing inorganic substances such as SiC, $SiO_2$, SiN and $Al_2O_3$ by use of the vapor deposition method, the sputtering method, etc.

The layer thickness of these protective layers is preferably from 0.1 to 2000 μm.

Figure 3:
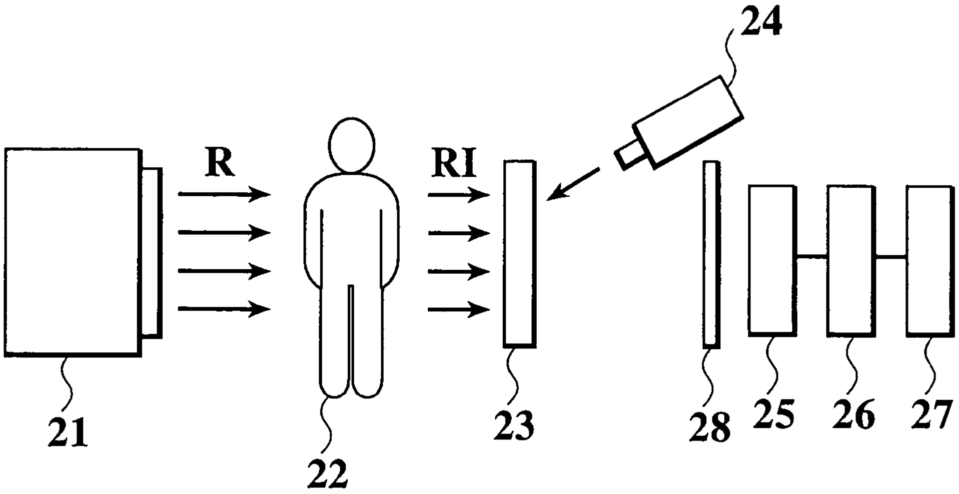
FIG. 3 is a schematic view showing one example of the construction of the radiographic image conversion panel according to the present invention.

FIG. 3 is a schematic view showing one example of the construction of the radiographic image conversion panel of the present invention.

In FIG. 3, the numeral 21 is a radiation generator, 22 is a subject, 23 is a radiographic image conversion panel having a visible light or infrared light photostimulable phosphor layer containing a photostimulable phosphor, 24 is a photostimulated excitation light source for discharging a radiographic latent image of the radiographic image conversion panel 23 as photostimulated luminescence, 25 is a photoelectric conversion device for detecting the photostimulated luminescence discharged by the radiographic image conversion panel 23, 26 is an image processing device for reproducing the photoelectric conversion signal detected by the photoelectric conversion device 25 as an image, 27 is an image display device for displaying the reproduced image, and 28 is a filter for transmitting only the light discharged by the radiographic image conversion panel 23.

In addition, FIG. 3 is an example of the case of obtaining a radiographic transmitted image of the subject 22. However, when the subject 22 itself emits radioactive rays, the radiation generator 21 is not required particularly.

Further, from the photoelectric conversion device 25, they are not limited to the above if it is possible to somehow reproduce optical information from the radiographic image conversion panel 23.

As shown in FIG. 3, when the subject 22 is disposed between the radiation generator 21 and the radiographic image conversion panel 23, and a radioactive ray R is irradiated, the radioactive ray R transmits through the subject 22 in accordance with changes of radiation transmittance, and its transmitted image RI (that is, an image of strength and weakness of radioactive ray) incidents into the radiographic image conversion panel 23.

The incident transmitted image RI is absorbed to the photostimulable phosphor layer of the radiographic image conversion panel 23, and thereby, electrons and/or positive holes whose number is proportional to the radiation dose absorbed in the photostimulable phosphor layer are generated, and these are accumulated at the trap level of the photostimulable phosphor.

That is, a latent image accumulating energy of the radiographic transmitted image is formed. Next, the latent image is excited with light energy and is actualized.

Further, the electrons and/or positive holes accumulated at the trap level are removed by irradiating a light in visible or infrared region to the photostimulable phosphor layer according to the light source 24, and the accumulated energy is discharged as photostimulated luminescence.

The strength and weakness of the discharged photostimulated luminescence are proportional to the number of the accumulated electrons and/or positive holes and the strength and weakness of the radiation energy absorbed in the photostimulable phosphor layer of the radiographic image conversion panel 23. This optical signal is, for example, converted into an electronic signal by the photoelectric conversion device 25 such as photomultiplier or the like, reproduced as an image by the image processing device 26, and the image is displayed by the image display device 27.

It becomes more effective if the image processing device 26 which can only reproduce the electronic signal as an image signal, but also can perform so-called image processing, arithmetic of image, storing and saving of image, and the like is used.

Further, when exciting the optical energy, it is required to separate the reflected light of the photostimulated excitation light and the photostimulated luminescence discharged from the photostimulable phosphor layer, and the sensitivity of a photoelectric conversion device 25, which receives luminescence discharged from the photostimulable phosphor layer, in response to the optical energy generally having short wavelength of not more than 600 nm becomes high. From these reasons, the photostimulated luminescence emitted from the photostimulable phosphor layer is desirable to have a spectrum distribution in a short wavelength region.

The luminescence wavelength band of the photostimulable phosphor according to the first embodiment of the present invention is between 300 nm and 500 nm, on the other hand, the photostimulated excitation wavelength band is between 500 nm and 900 nm, so that it satisfies the above-described conditions. However, recently, miniaturization of diagnostic apparatus proceeds, and a semiconductor laser whose excitation wavelength used for reading images of a radiographic image conversion panel is high power and which is easy to be downsized is preferable. The wavelength of the semiconductor laser is 680 nm, and the photostimulable phosphor incorporated in the radiographic image conversion panel of the present invention shows extremely good sharpness when an excitation wavelength of 680 nm is used.

That is, the photostimulable phosphors according to the first embodiment of the present invention show luminescence having a main peak of not more than 500 nm, is easy to separate the photostimulated excitation light, and moreover, corresponds well with the spectral sensitivity of a receiver. Therefore, it can receive lights effectively, and as a result, the sensitivity of an image reception system can be solidified.

As the photostimulated excitation light source 24, a light source including the photostimulated excitation wavelength of the photostimulable phosphor used in the radiographic image conversion panel 23 is used. Particularly, since the optical system becomes simple when a laser beam is used, and further, the photostimulated excitation light intensity can be made large, the photostimulated luminescence efficiency can be improved, so that further preferable results can be obtained.

As a laser, there are metal lasers and the like, such as He—Ne laser, He—Cd laser, Ar ion laser, Kr ion laser, $N_2$ laser, YAG laser and its second harmonic, ruby laser, semiconductor laser, various dye laser, copper vapor laser and the like. Usually, a continuous oscillation laser such as He—Ne laser, Ar ion laser or the like is desirable. However, a pulse oscillation laser can be used if the scanning time of one pixel of the panel is synchronized with the pulse.

Further, when the lights are separated by utilizing delay of luminescence without using the filter 28, as disclosed in Japanese Patent Laid-Open Publication No. Sho 59-22046, it is preferable to use a pulse oscillation laser rather than modulating by using a continuous oscillation laser.

Among the above-described various laser light sources, the semiconductor laser is small and cheap, and moreover, no modulator is required. Therefore, it is preferable to be used particularly.

As the filter 28, since it is for transmitting the photostimulated luminescence emitted from the radiographic image conversion panel 23 and for cutting the photostimulated excitation light, this is determined according to combination of the photostimulated luminescence wavelength of the photostimulable phosphor contained in the radiographic image conversion panel 23 and the wavelength of the photostimulated excitation light source 24.

For example, in case of combination preferable in practical use such that the photostimulated excitation wavelength is between 500 nm and 900 nm and the photostimulated luminescence wavelength is between 300 nm and 500 nm, a purple to blue glass filter such as C-39, C-40, V-40, V-42 or V-44 produced by Toshiba Corporation, 7-54 or 7-59 produced by Corning Corporation, BG-1, BG-3, BG-25, BG-37 or BG-38 produced by Spectrofilm Corporation, or the like can be used. Further, in case of using an interference filter, a filter having arbitrary properties can be selected and used to some extent. As the photoelectric conversion device 25, it may be anything if it is possible to convert changes of amount of light into changes of electronic signal, such as photoelectric tube, photomultiplier, photodiode, phototransistor, solar battery, photoconductive element and the like.

Second Embodiment:

Next, the second embodiment of the radiographic image conversion panel according to the present invention will be explained.

The radiographic image conversion panel according to the second embodiment, contains a photostimulable phosphor obtained by the predetermined method for manufacturing a radiographic image conversion panel. In the photostimulable phosphor, a main peak is shown from a (400) face in accordance with X-ray diffraction.

As a result of various investigations, the inventors have found that a phosphor in which a main peak is shown from the (400) face, is improved in luminance and reduced in afterglow, resulting in improvement in the emission properties of the phosphor.

By showing the main peak from the (400) face, it is presumed that in vapor deposition crystals, the transparency of columnar particles is increased, the luminance is improved and the crystal structure increased in stability of crystallinity (between lattices) is formed, resulting in improvement in the afterglow properties.

The photostimulable phosphor layer contains a photostimulable phosphor using an alkali halide represented by the above-described general formula (1) as a ground material. The preferable thicknesses of the photostimulable phosphor layer vary according to the intended use of the photostimulable phosphor or according to types of photostimulable phosphor. From the viewpoint of obtaining the effect of the present invention, the thickness thereof is 50 μm to 20 mm, preferably 50 μm to 1 mm, more preferably 50 to 300 μm, still more preferably 100 to 300 μm, and particularly preferably 150 to 300 μm.

As the photostimulable phosphor which can be used in the phosphor layer to be applied, similarly to the first embodiment, the photostimulable phosphor exhibiting a stimulated fluorescence having a wavelength of 300 to 500 nm by an excitation light having a wavelength of 400 to 900 nm is commonly used.

The photostimulable phosphor is manufactured by heating the same phosphor raw materials as the first embodiment in a vacuum. The heating temperature is at 400° C. or more. As phosphor materials of the photostimulable phosphor, the compounds described in (a) to (c) of the first embodiment are used. However, in the second embodiment, in addition, the activator may added to the phosphor materials. As a raw material of the activator, a compound including at least one metal atom selected from Eu, Tb, In, Cs, Ce, Tm, Dy, Pr, Ho, Nd, Yb, Er, Gd, Lu, Sm, Y, Tl, Na, Ag, Cu, Mg and the like, is used.

Next, the photostimulable phosphor layer of the present invention is manufactured by the above-described vapor phase growth method. As an evaporation source, the source prepared by adding Rb atoms so that a ratio of Rb atoms to Cs atoms is finally 5/1,000 mol or lower, preferably 1/1,000,000 to 5/1,000 mol, is used. By preparing the evaporation source at the ratio, the phosphor in which the main peak is shown from the (400) face, can be obtained. The vapor phase growth method can be performed in a vacuum, in an inert gas atmosphere, in a $H_2/N_2$ mixed gas atmosphere.

The photostimulable phosphor layer according to the second embodiment can be manufactured by a manufacturing method in which the above-described application method is adopted. The photostimulable phosphor layer is mainly made from a phosphor and a polymer resin. The photostimulable phosphor layer is formed by applying it to a support with a coater. The manufacturing method is the same as that of the first embodiment except the following matters.

In particular, in order to grow the phosphor in which the main peak is shown from the (400) face, the photostimulable phosphor application liquid is prepared by adding Rb atoms to a photostimulable phosphor of the photostimulable phosphor layer so that a ratio of the Rb atoms to Cs atoms is 5/1,000 mol or lower, preferably 1/1,000,000 to 5/1,000 mol. In the method for preparing the photostimulable phosphor application liquid, as a solvent, for example, one of the solvents explained in the first embodiment is used.

In the application liquid as a liquid phase including Cs atoms, after a predetermined liquid membrane phase is sequentially formed, the organic solvent having a solubility different from that of the application liquid is added under stirring. Then, the photostimulable phosphor precursor is obtained.

By calcining the obtained phosphor precursor at 600 to 800° C., a photostimulable phosphor is obtained.

EXAMPLES

The present invention is described in detail below by referring to the Examples, however, the embodiments of the present invention are not limited to these Examples.

Example 1

[Preparation of Radiographic Image Conversion Panel Samples A1 to A10]

Figure 4:
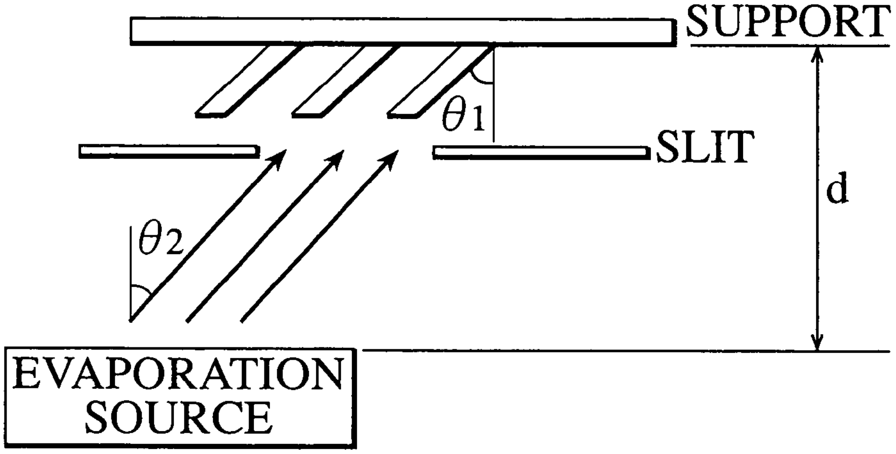
FIG. 4 is a schematic view showing one example of the method for preparing the photostimulable phosphor layer on the support by vapor deposition.

According to the conditions shown in Table 1, a photostimulable phosphor layer having a photostimulable phosphor (CsBr:Eu) was formed on the surface of a support of glass ceramics (produced by Nippon Electric Glass Co., Ltd.) having a thickness of 1 mm by using a deposition apparatus (wherein θ1 and θ2 are set to θ1=5° and θ2=5°) shown in FIG. 4.

In the deposition apparatus shown in FIG. 4, the distance d between the support and an evaporation source was made to be 60 cm. Then, by using a slit made of aluminum, deposition was performed by carrying the support toward the direction parallel to the longitudinal direction of the slit so as to obtain a photostimulable phosphor layer having a thickness of 300 μm.

In the vapor deposition, the support was placed in the vapor deposition apparatus, 1 mol of CsBr:Eu was then placed in every ¼ mol portion on each of four boats to prepare a first evaporation source. Then, $EuBr_2$ as a second evaporation source was divided into two boats to give the Eu amount ratio shown in Table 1, and the evaporation sources 1 and 2 were press-molded and fed into a water-cooled crucible.

Thereafter, the air inside of the deposition apparatus 1 was discharged, and $N_2$ gas was introduced. After the degree of vacuum was adjusted to 0.133 Pa, the vapor deposition was performed under the conditions where the temperature of the first and second evaporation sources was 700° C. and the deposition rate of each source was 10 μm/min. The vapor deposition was completed when the film thickness of the photostimulable phosphor layer was 300 μm. Subsequently, the phosphor layer was subjected to a heat treatment at a temperature of 400° C. In an atmosphere of dried air, the support and the peripheral portion of a protective layer having a borosilicate glass were sealed by an adhesive to obtain the radiographic image conversion panel sample A-1 (sample A-1) having a construction where the phosphor layer was sealed.

Next, in Example 1, the radiographic image conversion panel samples A-2 to A-10 were prepared (samples A-2 to A-10) in the same manner as in Example 1, except for using the evaporation sources 1 and 2 as shown in Table 1 and giving the Eu amount ratio as shown in Table 1.

The respective radiographic image conversion panels (samples A-1 to A-10) prepared were evaluated as follows.

[Evaluation of Luminance]

The luminance was evaluated by using the Regius 350 produced by Konica Corporation.

[Evaluation Method and Evaluation Criteria of Durability]

Durability was evaluated under the conditions of 30° C. and 80% in a state where a vapor deposition film formed on the substrate (support) was not sealed.

As the evaluation of durability, there was measured the time which the luminance takes to decrease to 80% of the initial value.

Further, the ratio between the Eu amount in the front end of the photostimulable phosphor crystal and the Eu amount in the vicinity of the support (the amount ratio of Eu) was determined by the method described above in detail.

Further, a mean crystal size (a mean value of 10 phosphor crystals) was measured by XRD and calculated using the Scherrer's method.

temperature) at about 150° C. The vapor deposition was completed when the film thickness of the photostimulable phosphor layer was 300 μm.

The support having provided thereon the photostimulable phosphor layer was placed and sealed in a barrier bag (GL-AE, produced by Toppan Printing Co., Ltd.) of which the rear surface was stuck with an AL foil, whereby a radiographic image conversion panel sample B-1 was prepared.

TABLE 1

| Sample | First Evaporation Source | Second Evaporation Source | Eu Amount Ratio | Mean Crystal Size (nm) | Luminance | Durability | Remarks |
|---|---|---|---|---|---|---|---|
| A-1 | CsBr element | $EuBr^2$ element | 0.9 | 95 | 1.34 | 30 days | Present Invention 1 |
| A-2 | CsBr:Eu | $EuBr^2$ element | 0.9 | 99 | 1.22 | 28 days | Present Invention 2 |
| A-3 | CsBr:Eu | CsBr:Eu | 0.9 | 105 | 1.88 | 45 days | Present Invention 3 |
| A-4 | CsBr:Eu | CsBr:Eu | 0.8 | 101 | 1.86 | 60 days | Present Invention 4 |
| A-5 | CsBr:Eu | CsBr:Eu | 0.7 | 110 | 1.77 | 80 days | Present Invention 5 |
| A-6 | CsBr:Eu | CsBr:Eu | 0.6 | 106 | 1.78 | 90 days | Present Invention 6 |
| A-7 | CsBr:Eu | CsBr:Eu | 0.5 | 108 | 1.66 | 100 days | Present Invention 7 |
| A-8 | CsBr:Eu | — | 1 | 85 | 0.21 | 2 hours | Comparative Example 1 |
| A-9 | CsBr:Eu | — | 1.1 | 83 | 0.02 | 30 minutes | Comparative Example 2 |
| A-10 | CsBr:Eu | — | 1.2 | 80 | 0.01 | 10 minutes | Comparative Example 3 |

As is apparent from Table 1, it is found that the samples of the present invention are excellent as compared with those of Comparative Examples.

Example 2

[Preparation of Radiographic Image Conversion Panel Samples B1 to B10]

(Method for Forming Phosphor Particles—Prepared by Deposition)

According to the conditions shown in Table 2, a photostimulable phosphor layer having a photostimulable phosphor (CsBr:Eu) was formed on the surface of a support of glass ceramics (produced by Nippon Electric Glass Co., Ltd.) having a thickness of 1 mm by using a deposition apparatus (wherein θ1 and θ2 are set to θ1=5° and θ2=5°) shown in FIG. 4.

In the deposition apparatus shown in FIG. 4, the distance d between the support and an evaporation source was made to be 60 cm. Then, by using a slit made of aluminum, deposition was performed by carrying the support toward the direction parallel to the longitudinal direction of the slit so as to obtain a photostimulable phosphor layer having a thickness of 300 μm.

In the vapor deposition, the support was placed in the vapor deposition apparatus, Rb in an amount described in Table 1 was added to phosphor raw materials (CsBr: Eu) and the resulting mixture was fed into a water-cooled crucible after being shaped using a press as a evaporation source.

As a result of the X-ray analysis, there was obtained a phosphor in which a main peak is shown from a (400) face.

Subsequently, the vapor deposition apparatus was once degassed and then an $N_2$ gas was introduced thereinto to adjust a degree of vacuum to $1\times10^{-1}$ Pa. Thereafter, the vapor deposition was carried out while maintaining a temperature of the support (also referred to as a substrate The samples B-2 to B-6 were obtained in the same manner as in sample B-1, except for changing the added amount of Rb, and the heating temperature and atmosphere for forming phosphors.

In the phosphors of the samples B-2, B-3, B-5 and B-6, a main peak is shown from the (400) face.

(Phosphor Layer—Prepared by Application)

$CsCO_3$, HBr and $Eu_2O_3$ were mixed so that the amount of Eu was 5/10000 mol per 1 mol of CsBr, followed by dissolving. Further, Rb was added thereto in an amount described in Table 2. The aqueous solution was condensed at 90 to 110° C. to prepare a saturated solution, thereby serving this as an aqueous solution liquid phase.

On the liquid phase, an EDTA liquid film forming layer and a phase comprising isopropyl alcohol are sequentially formed. This liquid was stirred at 3000 rpm by a homogenizer to result in precipitation of spherical CsBr particles and thereby obtaining a CsBr:Er phosphor precursor with a size of 5 micron.

The ratio between the aqueous phase and the organic phase was 1:1.

The phosphor precursor was subjected to calcination at 620° C. for 2 hours in a vacuum atmosphere to form a phosphor particle.

For forming a phosphor layer, the phosphor particle and a polyester solution (BYRON 63 ss, produced by Toyobo Co., Ltd.) were mixed and dispersed as a resin solution having a solid content concentration of 95% by mass and a phosphor concentration of 5% by mass to prepare a coating material.

On the surface of a polyethylene terephthalate film (size: 188×30, produced by Toray Industries, Inc.) support with a size of 188 micron, this application material was coated and dried in a drying zone comprising three zones of 80° C., 100° C. and 110° C. in an Ar inert oven under a drying atmosphere at a rate of CS: 2 m/min to form a photostimulable phosphor layer.

A sheet having formed thereon the photostimulable phosphor layer was placed and sealed in a barrier bag (GL-AE, produced by Toppan Printing Co., Ltd.) of which the rear surface was stuck with an AL foil, whereby a radiographic image conversion panel (sample B-7) was prepared.

The samples B-8 to B-10 were prepared in the same manner as in sample B-7, except for changing the added amount of Rb, and the heating temperature and atmosphere for forming phosphor particles as shown in Table 2.

In the phosphors of the samples B-7 and B-8, a main peak is shown from the (400) face.

Each sample was subjected to the following evaluations.

[Evaluation of Sharpness]

The sharpness of respective radiographic image conversion panel samples prepared was evaluated by determining a modulation transfer function (MTF).

The MTF was determined by a method where a CTF chart was attached to each radiographic image conversion panel sample, each sample was then irradiated with an X-ray of 80 kVp in an amount of 10 mR (a distance to the object: 1.5 m), and the CTF chart image was scanned and read out by use of a semiconductor laser (Wavelength: 680 nm, Power at the surface of panel: 40 mW) with a diameter of 100 μm. Values in Table are shown by a summation of MTF values at 2.0 lp/mm. The results obtained are shown in Table 2.

[Evaluation of Luminance]

The luminance was evaluated by using the Regius 350 produced by Konica Corporation.

In the same manner as in the evaluation of sharpness, an X-ray was irradiated at a distance between the radiation source and the plate of 2 m by use of a tungsten vessel at a tube voltage of 80 kVp and a tube current of 10 mA. Thereafter, emitted light was read out by use of Regius 350 provided with a plate. The evaluation was performed based on the obtained electric signals from a photomultiplier.

The photographed in-plane electric signal distributions obtained from the photomultiplier, were comparatively evaluated to determine standard deviations which were designated as luminance distributions of each sample (S. D.). As the value is smaller, the luminance unevenness is more reduced.

[Evaluation of Afterglow]

Each sample was cut into a square of 50 mm, affixed to a plate and set into a radiographic cassette.

When X-rays are irradiated and the radiographic image is read, the signal difference from the 50th picture element is designated as an afterglow value. In Table, the temperature expresses a heating temperature of respective phosphor fine particles.

TABLE 2

| Sample | Added Amount of Rb (mol/Cs 1 mol) | Heating Temperature (° C.) | Atmosphere | (400) Face Ratio | Luminance | MTF (21 p/mm) | Luminance Unevenness (S.D.) | Afterglow |
|---|---|---|---|---|---|---|---|---|
| B-1 | 5/100000 | 600 | vacuum | 2:1 | 1.67 | 32% | 4 | 0.00004 |
| B-2 | 5/10000 | 600 | vacuum | 4:1 | 1.72 | 33% | 8 | 0.00002 |
| B-3 | 5/1000 | 600 | vacuum | 3:1 | 1.54 | 31% | 10 | 0.00003 |
| B-4 | 1/100 | 600 | vacuum | 1:2 | 0.43 | 11% | 43 | 0.00002 |
| B-5 | 5/10000 | 600 | Ar | 3:1 | 1.22 | 32% | 9 | 0.00005 |
| B-6 | 5/10000 | 600 | $H_2/N_2$ | 3:1 | 1.18 | 34% | 8 | 0.00004 |
| B-7 | 5/10000 | 600 | vacuum | 4:1 | 1.52 | 31% | 3 | 0.00001 |
| B-8 | 5/10000 | 600 | vacuum | 4:1 | 1.55 | 35% | 4 | 0.00008 |
| B-9 | 0 | | | | 0.12 | 12% | 56 | 0.00321 |
| B-10 | 0 | | | | 0.10 | 10% | 44 | 0.00582 |

In Table 2, 1. samples B-1 to B-3, B-5 and B-6 (present invention), sample B-4 (comparative example) vapor deposition type 2. samples B-7 and B-8 (present invention), samples B-9 and B-10 (comparative example) application type As can be seen from Table 2, the samples according to the present invention are excellent as compared with comparative samples.

The radiographic image conversion panel and the method for manufacturing the radiographic image conversion panel according to the present invention ensure high luminance and high sharpness, and have an excellent effect also on durability.

The radiographic image conversation panel and method for manufacturing a phosphor according to the present invention are reduced in afterglow and has an excellent effect on luminance and sharpness despite the low cost.

The entire disclosure of Japanese Patent Applications No. Tokugan 2002-343432 filed on Nov. 27, 2002 and No. Tokugan 2003-79233 filed on Mar. 24, 2003 including specification, claims, drawings and summary are incorporated herein by reference in its entirety.

What is claimed is:

1. A radiographic image conversion panel comprising:

a support; and at least one photostimulable phosphor layer provided on the support, wherein at least one layer of the photostimulable phosphor layers is formed by a photostimulable phosphor represented by a following general formula (1), and a density of activation metal atoms at an end of a photostimulable phosphor crystal and a density of activation metal atoms in the vicinity of the support satisfy a following formula 1:

$$0 \leqq \text{(the density of the activation metal atoms at the end of the photostimulable phosphor crystal)} / \text{(the density of the activation metal atoms in the vicinity of the support)} < 1,$$ and the general formula (1) is expressed by $$M^1X.aM^2X'_2.bM^3X''_3:eA \qquad (1)$$

wherein the $M^1$ is at least one kind of alkali metal selected from a group consisting of Li, Na, K, Rb and Cs, the $M^2$ is at least one kind of bivalent metal atom selected frown a group consisting of Be, Mg, Ca, Sr, Ba, Zn, Cd, Cu and Ni, the $M^3$ is at least one kind of trivalent metal atom selected from a group consisting of Sc, Y, La, Ce, Pr, Nd, Pm, Sm, Eu, Gd, Tb, Dy, Ho, Er, Tm, Yb, Lu, Al, Ga and In, each of the X, the X' and the X" is at least one kind of halogen selected from a group consisting of F, Cl, Br and I, the A is at least one kind of metal atom selected from a group consisting of Eu, Tb, In, Ce, Tm, Dy, Pr, Ho, Nd, Yb, Er, Gd, Lu, Sm, Y, Tl, Na, Ag, Cu and Mg and each of the a, the b and the e represents a numeric value in a range of $0 \leqq a < 0.50$, $0 \leqq b < 0.5$ and $0 < e \leqq 0.2$.

2. The radiographic image conversion panel of claim 1, wherein the photostimulable phosphor is CsBr:Eu.

3. A method for manufacturing the radiographic image conversion panel of claim 1, comprising controlling a deposition rate of a main agent of the photostimulable phosphor and a deposition rate of an activator of the photostimulable phosphor by at least two or more systems.

* * * * *